United States Patent [19]

Thompson

[11] 4,203,792
[45] May 20, 1980

[54] METHOD FOR THE FABRICATION OF DEVICES INCLUDING POLYMERIC MATERIALS

[75] Inventor: Larry F. Thompson, Gillette, N.J.

[73] Assignee: Bell Telephone Laboratories, Incorporated, Murray Hill, N.J.

[21] Appl. No.: 852,504

[22] Filed: Nov. 17, 1977

[51] Int. Cl.$^2$ .................. B29C 19/02; B05D 3/06; B05D 5/12

[52] U.S. Cl. .................. 156/272; 29/584; 29/588; 156/305; 313/512; 357/17; 357/73; 427/53; 427/54; 427/74; 427/82; 427/86; 427/163; 427/386; 428/913

[58] Field of Search .................. 427/54, 82, 83, 86, 427/87, 374 R, 386, 430 R, 74, 163, 53; 29/588, 584; 357/72, 73, 17; 313/512; 96/38.3; 428/913; 156/272, 305

[56] References Cited

U.S. PATENT DOCUMENTS

| 3,492,157 | 1/1970 | Shintard et al. ............ 427/82 X |
| 3,772,062 | 11/1973 | Shur et al. ............ 204/159.15 X |
| 3,776,729 | 12/1973 | Levy ............ 204/159.15 X |
| 3,931,354 | 1/1976 | Sheppard et al. ............ 427/386 X |
| 3,935,330 | 1/1976 | Smith et al. ............ 427/41 |
| 3,939,488 | 2/1976 | Wakashima et al. ............ 427/82 X |
| 4,025,407 | 5/1977 | Chang et al. ............ 427/54 X |

OTHER PUBLICATIONS

Thompson, et al., "Lithography and Radiation Chemistry of Epoxy Containing Negative Electron Resist.," Polymer Eng. and Science vol. 14, No. 7, pp. 529-533 (1974).

Jayson et al., "Coupling Circuits with Light.," Bell Laboratories Record, pp. 20-25 (Jan. 1976).

*Primary Examiner*—Ronald H. Smith
*Assistant Examiner*—Thurman K. Page
*Attorney, Agent, or Firm*—Peter V. D. Wilde; Allen N. Friedman

[57] ABSTRACT

The disclosed device fabrication method makes use of a multicomponent polymer material comprising a mixture of radiation curable material and thermally curable material. The multicomponent polymer is dispensed onto a substrate and irradiated with actinic radiation. A heat cure is then performed. This method provides an initial gelling of the multicomponent polymer material so that the desired shape of the dispensed material may be retained while the heat cure is performed. This method has been applied successfully to a class of optoelectronic devices known as opto-isolators or optically coupled isolators.

12 Claims, 2 Drawing Figures

METHOD FOR THE FABRICATION OF DEVICES INCLUDING POLYMERIC MATERIALS

BACKGROUND OF THE INVENTION

1. Field of the Invention

The invention is in the field of manufacturing methods for the shaping of polymeric materials.

2. Description of the Prior Art

Devices of a class of opto-electronic devices comprise a substrate, at least one semiconductor element, which is electrically connected to the substrate, and a dome-shaped transparent member which encloses the semiconductor element. In many such devices the semiconductor elements include at least one light emitting semiconductor element, such as a diode, and at least one light responsive semiconductor device, such as a phototransistor. These opto-electronic devices are known as opto-isolators or optically coupled isolators. The light responsive semiconductor device produces an electrical signal in response to light received from the light emitting semiconductor device. The light travels from the emitter to the responsive device within the dome-shaped member. The dome-shaped member is then enclosed by an opaque material to confine the light and shield the light responsive device from ambient light.

In one prior art embodiment, the dome-shaped transparent member is composed of a polymer material, such as a silicone. In one method for the formation of such a device, the dome-shaped transparent member is formed by first preheating the substrate to a temperature of from 360 to 400 degrees Fahrenheit, then dispensing a quantity of the polymer onto the preheated substrate. This produces an immediate partial cure of the dome-shaped transparent member, before it can flow out along the substrate. In this method, the viscosity of the single polymer material, the pressure with which it is dispensed and the temperature of the preheated substrate must all be carefully controlled so as to insure that the dome-shaped transparent member retains its desired shape. If this shape is not retained, some limitations are imposed upon the functioning of some opto-isolators through reduction of the coupling efficiency within the device and producing light leakage to the ambient. It may also be desired to avoid preheating the substrate as either the substrate or some of the materials affixed to the substrate may be heat sensitive and adversely affected.

SUMMARY OF THE INVENTION

The technique disclosed herein permits the thermal curing of a quantity of polymeric material with an unconfined convex curved surface, while maintaining the shape of that surface. This is accomplished without the substrate preheating required by the above-mentioned prior art process. This method involves the use of a multicomponent polymeric material. The multicomponent polymeric material includes a minor amount of radiation curable material combined with a major amount of thermally curable material. The method consists of dispensing a quantity of the multicomponent polymer material in a viscous fluid state onto a substrate, thus forming the convex curved (typically dome-shaped) member. The portion is then irradiated with actinic radiation to gel the radiation curable material. Then the member is thermally cured. The irradiation cure allows the member to maintain the desired convex curved shape during the final thermal cure. The initial partial cure can thus be accomplished even though the substrate is not, necessarily, preheated.

This process has been used in the fabrication of opto-electronic devices of the class known as opto-isolators. In such devices the subject polymeric material must be transparent to the light emitted by the incorporated electroluminescent diode. In one exemplary embodiment, the radiation curable material is a polyfunctional acrylate which includes two acrylate groups. In this embodiment, the thermally curable material is an epoxidized polybutadiene. The multicomponent polymeric material also includes a radiation initiator to polymerize the polyfunctional acrylate. Benzoin methyl ether may be used if the actinic radiation is ultraviolet light as is done in the exemplary embodiment. A thermal initiator such as an amine and a cross-linker such as dodecenyl succinic anhydride or hexahydrophthalic anhydride to cross-link the epoxidized polybutadiene may also be constituents of the multicomponent polymer material. The system is then gelled by ultraviolet light and cured completely by subsequent thermal treatment. This particular method permits maintenance of the shape of the unsupported convex transparent member during the thermal treatment. During such thermal treatment, ungelled polymer bodies would, typically, sag and creep out along the substrate.

DETAILED DESCRIPTION

The opto-electronic devices which benefit from these teachings are exemplified by a class of devices known as opto-isolators. Other classes of opto-electronic devices to which the method may be applied include devices such as photodiodes. Opto-electronic devices include at least one semiconductor element (or body), which usually includes at least one light emitting semiconductor device, and may also include at least one light responsive device. Opto-isolators include at least one light emitting semiconductor device and at least one light responsive semiconductor device, which produces an electrical signal from the light emitted by the light emitting semiconductor device. The semiconductor elements are included within a dome-shaped transparent member and are electrically connected to a substrate or support member such as a metal lead frame. The opto-isolator can then be enclosed by an opaque body of polymer adapted for diffusely reflecting light.

Figure 1:
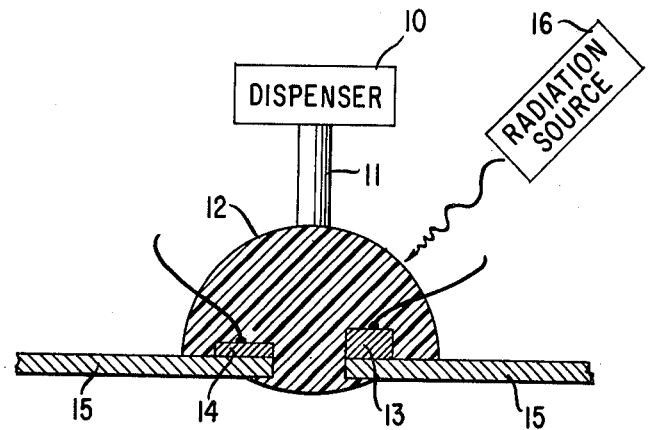
FIG. 1 is an elevational view in section of an exemplary opto-electronic device, which includes one light emitting semiconductor element, one light responsive semiconductor element, a dome-shaped transparent member and a support member.

FIG. 1 demonstrates how the dome-shaped transparent member is dispensed from a dispenser 10, through a dispenser tube 11 so that it encloses, in this embodiment, one light emitting semiconductor device 13, and one light responsive semiconductor device 14. The dome-shaped transparent member, 12, is dispensed onto the substrate 15. It would be obvious to one skilled in the art that FIG. 1 exemplifies an opto-electronic device that includes at least one light emitting semiconductor device and may also include at least one light responsive semiconductor device. Other possible methods of dispensing include dipping the support member into a pot of the polymeric material.

Figure 2:
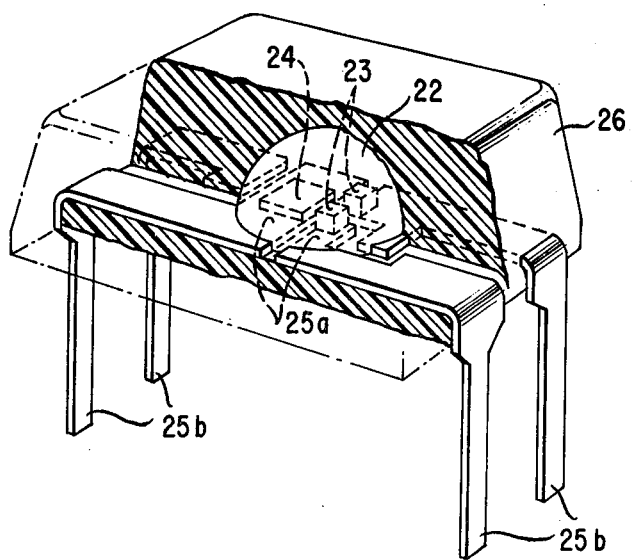
FIG. 2 is a perspective view, partially cutaway, of an exemplary finished opto-isolator showing the location of two light emitting semiconductor elements and one light responsive semiconductor element on the support member, the dome-shaped transparent member and an opaque body of polymer encapsulating the opto-isolator.

FIG. 2 illustrates another exemplary opto-isolator. In this figure, a dome-shaped transparent member 22, encapsulates two light emitting semiconductor devices 23, and one light responsive semiconductor device 24. A radiation source 16, as shown, is used in the initial gel portion of the curing cycle of the dome-shaped transparent member. The substrate 25a is a lead frame. An opaque body of a polymer 26 constitutes the outer light-reflecting enclosure. The lead frame prongs 25b are not enclosed, so as to allow for outside electrical connection.

This disclosure teaches a method for the fabrication of the dome-shaped transparent member and the devices produced thereby. In the class of opto-isolators, the dome-shaped transparent member is used as an electrically insulating medium that allows for optical coupling between the at least one light emitting semiconductor device and the at least one light responsive semiconductor device, while maintaining their electrical isolation. A dome of approximately hemispherical shape best fulfills this function. The method described in this disclosure insures that the desired shape is obtained. The method consists of dispensing a portion of a multicomponent polymeric material onto a substrate so that the portion does not lose contact with the dispenser until it has contacted the substrate. The portion of the multicomponent polymer system is then irradiated with actinic radiation to gel it into the desired shape which is retained while a final heat cure is performed.

One component of the multicomponent polymer system which is a polyfunctional resin is cured by the irradiation while another portion which is the thermally curable material is cured by a heat cure.

The actinic radiation is used for cross-linking of the radiation curable polymer. Various materials can be cross-linked by irradiation with different frequencies of actinic radiation. Actinic radiation is radiant energy which can produce chemical changes and includes the visible and ultraviolet portion of the spectrum or any other radiation producing such changes. With the preferred materials discussed below, ultraviolet radiation was used.

The multicomponent polymer material comprises a mixture of a minor amount of a radiation curable material with a major amount of a thermally curable material. The radiation curable material constitutes less than half of the weight of the combined material. It is included in such quantity as to produce the desired gelling action, while permitting the desired mechanical properties of the thermally curable material to dominate the properties of the totally cured combination material. In the preferred embodiment the minor amount of the radiation curable material represents from five to fifteen percent by weight of the multicomponent polymer material. If there is less than five percent, there is not enough radiation curable material present to ensure successful gelling. However, if amounts greater than fifteen percent are used, some undesirable properties of the radiation curable material may become too pronounced for effective use. In the exemplary system mentioned above, the radiation curable material imparts brittleness so a percentage greater than fifteen percent is not desirable. The radiation curable material may be a polyfunctional resin each unit of which contains at least two substituents which can be acrylate or methacrylate groups. Tetraethylene glycol diacrylate and 1,4 butylene glycol diacrylate are examples of such radiation curable materials.

The thermally curable material can be an epoxidized polybutadiene that has a gram molecular weight from 1000 to 4000. This epoxidized polybutadiene is from five to twenty-five percent epoxidized, that is to say, five to twenty-five percent of the available double bonds have been reacted to an epoxy group.

In order to produce the desired degree of elasticity the degree of epoxidation must be controlled with higher degree epoxidation resulting in less elasticity. The polybutadiene is a rubber whose viscosity increases as molecular weight increases. Epoxidizing it makes the material less elastic. For the exemplary method described in this disclosure, the degree of elasticity defined by a range from a gram molecular weight of 1000 to 4000 percent and epoxidation of five to twenty-five percent is preferred.

The multicomponent polymer material can also include a cross-linker used for bridging the epoxy groups of the thermally curable material. If the thermally curable material is an epoxy containing material this cross-linker can be dodecenyl succinic anhydride (DDSA) or hexahydrophthalic anhydride (HHPA). It is common practice to include a cross-linker when using an epoxidized polymer.

The multicomponent polymer material may include a thermal initiator. Usually an amine, the thermal initiator is used to initiate cross-linking of the thermally curable material.

A radiation initiator may be part of the multi-component polymer material. The radiation initiator is used to initiate cross-linking of the radiation curable material particularly when electromagnetic radiation (as opposed to electron beam radiation) is used.

EXAMPLES:

EXAMPLE 1

In one example, ten grams of an epoxidized polybutadiene of a gram molecular weight of 2000 that was 12 percent epoxidized was mixed with 0.5 grams of hexahydrophthalic anhydride, 0.025 nl of N,N-dimethyl benzylamine (which is approximately 0.025 grams) one gram of 1,4 butylene glycol diacrylate and 0.02 grams of benzoin methyl ether, which is the radiation initiator. The mixture was dispensed onto the substrate, irradiated with ultraviolet light from a 200 watt mercury lamp placed approximately ten inches away from the sample for 1½ minutes, cured for eight hours at 100 degrees Celsius.

EXAMPLE 2

In another trial, five grams of epoxidized polybutadiene of the same molecular weight and percent epoxidation as in Example 1, 0.75 grams of dodecenyl succinic anhydride, 0.025 grams of the amine used in Example 1, 0.5 grams of tetraethylene glycol diacrylate, and 0.07 grams of benzoin methyl ether were mixed together. Once the mixture was dispensed, it was exposed to ultraviolet radiation from the same lamp at approximately the same distance as described in Example 1 for five minutes then cured thermally at 100 degrees C. for 16 hours.

EXAMPLE 3

In a third trial, five grams of epoxidized polybutadiene of the same molecular weight and percent epoxidation as in the above examples, was mixed with 0.4 grams of HHPA, 0.025 grams of the same amine as in the above examples, 0.5 grams of tetraethylene glycol diacrylate and 0.01 grams of benzoin methyl ether. The sample was gelled and thermally cured as described in Example 2.

The material compositions used in the above examples were particularly advantageous as the components of the multicomponent polymer system were compatible producing a transparent mixture, not a cloudy one as happened with some other compositions tried. This property of low turbidity is desirable for the exemplary opto-electronic device use.

What is claimed is:

1. A method of semiconductor device fabrication comprising
   (a) forming a mixture of a thermally curable polymeric material and an effective amount of thermal initiator to bring about substantially complete reaction of the polymeric material upon thermally curing the mixture,
   (b) dispensing a quantity of the mixture onto a support member, which quantity has an unconfined dome-shaped surface, and
   (c) thermally curing the mixture characterized in that the mixture additionally contains at least effective amounts of a radiatively curable polymer additive and a radiation initiator additive, and further characterized in that prior to thermally curing the quantity of polymeric material it is exposed to actinic radiation, whereby the radiatively curable polymer is cured, resulting in a gelling of the quantity and the persisting of the quantity's dome-shaped surface during the following thermal cure.

2. Method of claim 1 in which the support member includes at least one semiconductor circuit element and the polymeric material is dispensed so as to surround the circuit element.

3. Method of claim 1 in which the dispensing step consists essentially of dipping a portion of the support member into a body of the polymeric material.

4. Method of claim 2 in which the at least one semiconductor circuit element is a light emissive or a light responsive element, and in which the polymeric material is transparent to the light.

5. A method of claim 4 in which the actinic radiation is ultraviolet light and the radiation initiator is benzoin methyl ether.

6. A method of claim 4 in which the thermal initiator is an amine.

7. A method of claim 4 in which the actinic radiation is ultraviolet light.

8. A method of claim 7 in which the radiation curable material is a polyfunctional resin each unit of which includes at least two substituents where the substituents are acrylate or methacrylate groups and the thermally curable material is an epoxidized polybutadiene.

9. A method of claim 8 in which the epoxidized polybutadiene consists of a polybutadiene of a gram molecular weight from 1000 to 4000 which is from five to twenty-five percent epoxidized.

10. A method of claim 9 in which the radiation curable material comprises from five to fifteen percent by weight of the multicomponent polymeric material.

11. A method of claim 4 in which the circuit element device is an optically coupled isolator comprising at least one light emissive body optically coupled by the dome-shaped transparent member to at least one light responsive body which produces an electrical signal in response to the light received from the light emissive body which optically coupled isolator is enclosed by an opaque body of a second polymer.

12. A method of claim 11 in which the opaque body of a second polymer is a light-reflecting enclosure.

* * * * *